(12) United States Patent
Yamada

(10) Patent No.: US 6,342,819 B1
(45) Date of Patent: Jan. 29, 2002

(54) FREQUENCY SYNTHESIZER DEVICE AND MOBILE RADIO DEVICE USING THE SAME

(75) Inventor: Ryoichi Yamada, Yokosuka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/695,118

(22) Filed: Oct. 24, 2000

(30) Foreign Application Priority Data

Oct. 28, 1999 (JP) .......................................... 11-307549

(51) Int. Cl.$^7$ ................................................. A03L 7/16
(52) U.S. Cl. ............................... 331/25; 331/8; 331/16; 327/156; 455/260
(58) Field of Search ............................... 331/8, 16, 18, 331/25; 327/156–159; 375/376; 455/260

(56) References Cited

U.S. PATENT DOCUMENTS 4,736,167 A * 4/1988 Kojima et al. ................. 331/17

FOREIGN PATENT DOCUMENTS

| JP | 64-5769 | 1/1989 |
|---|---|---|
| JP | 8-8741 | 1/1996 |

* cited by examiner

*Primary Examiner*—David Mis
(74) *Attorney, Agent, or Firm*—Pearne & Gordon LLP

(57) ABSTRACT

In a frequency synthesizer device in which a frequency-division ratio control circuit 6 and other circuits are integrated on the same semiconductor substrate, a power supply 8 for supplying a power to the frequency-division ratio control circuit 6 is provided separately from a power supply 7 for supplying a power to other circuits. A power supply voltage supplied from the power supply 8 to the frequency-division ratio control circuit 6 is set lower than a power supply voltage supplied to other circuits. The noise generated by the frequency-division ratio control circuit 6 can be reduced by setting the power supply voltage lower, and also C/N degradation can be reduced. Since the noises can be suppressed even if the frequency is increased, a lock-up time can be reduced and the lower power consumption can be attained.

8 Claims, 4 Drawing Sheets

FREQUENCY SYNTHESIZER DEVICE AND MOBILE RADIO DEVICE USING THE SAME

BACKGROUND OF THE INVENTION

1. Field of the Invention

The present invention relates to a frequency synthesizer device and a mobile radio device using the same and, more particularly, a frequency synthesizer device in which a power supply voltage of a frequency-division ratio control circuit is lowered and a mobile radio device using the same.

2. Description of the Related Art

In the case of the mobile radio device, for example, the frequency synthesizer device is used to produce the carrier wave with any frequency from the reference signal. Thus, the high-speed lock up is requested to attain high C/N and low power consumption in the intermittent reception, etc. In the case of the normal frequency synthesizer device, the setting interval of the output frequency of the voltage-controlled oscillator is limited by the comparison frequency of the phase comparator. In order to obtain the finer setting interval, the comparison frequency must be lowered, so that the lock-up time cannot be shortened.

As the frequency synthesizer device that can shorten the lock-up time, there is the frequency synthesizer device that is normally called the fractional-N system. As shown in FIG.4, this frequency synthesizer device comprises a voltage-controlled oscillator (VCO) 1 for oscillating a signal having a frequency in response to an input voltage, a first frequency divider 2 for frequency-dividing the frequency of the output signal of the VCO, a second frequency divider 5 for frequency-dividing a frequency of the reference signal, a phase comparator 3 for comparing phase of an output signal (fdiv) of the first frequency divider 2 with phase of an output signal (fref) of the second frequency divider 5 to output phase difference, a low-pass filter (LPF) 4 for smoothing an output of the phase comparator 3, and a frequency-division ratio control circuit 6 for controlling a frequency-division ratio by using the fdiv as a clock such that the frequency-division ratio is changed in time and a value of its time average contains a value below the decimal point.

As set forth in Patent Application Publication (KOKAI) Hei 8-8741, the frequency synthesizer device of this fractional N system can produce equivalently an average frequency-division ratio by changing the frequency-division ratio set in the first frequency divider in time in synchronism with the signal fdiv. Therefore, there is no need that the frequency of fvco should be set to integral multiple of the frequency of fref, so that the frequency of fref can be set high irrespective of the desired frequency interval in fvco. As a result, the lock-up time can be reduced. In the integrated circuit in which such frequency synthesizer device in the prior art is integrated on the same semiconductor substrate, since the frequency division ratio control circuit must perform a complicated operation, its circuit scale is large and such integrated circuit consists of digital circuits such as CMOS, etc.

However, in the integrated circuit in which analogue circuits and digital circuits are integrated on the same semiconductor substrate, like the frequency synthesizer device in the prior art, since the maximum power is consumed at change points of the clock for the digital circuits, potential of the semiconductor substrate and potential of the power supply are varied in synchronism with the clock. Therefore, there are problems such that variation in these potential generates the noise, degrades the C/N of the frequency synthesizer device, and prevents the realization of high C/N and high-speed lock-up. Also, there is another problem such that, as the comparison frequency is set higher to put the feature of the fractional-N system to practical use, the noise generated by the frequency-division ratio control circuit is increased to increase the C/N degradation. In addition, there is still another problem such that, if both the transmitter portion and the receiver portion are integrated on the same semiconductor substrate even though the characteristics as the frequency synthesizer device can be satisfied, the transmitting/receiving characteristics are degraded because of the interference of the noise generated by the frequency-division ratio control circuit.

SUMMARY OF THE INVENTION

The present invention has been made to overcome such problems, and it is an object of the present invention to provide a frequency synthesizer device capable of reducing noises generated by a frequency-division ratio control circuit to improve a C/N ratio, reducing a lock-up time, and reducing a power consumption and a mobile radio device using the same.

In order to overcome the above subjects, in the present invention, a frequency synthesizer device is constructed by comprising a voltage-controlled oscillator for oscillating a signal having a frequency in response to an input voltage; a first frequency divider for frequency-dividing a frequency of an output signal of the voltage-controlled oscillator; a second frequency divider for frequency-dividing a frequency of a reference signal; a phase comparator for outputting a signal of phase difference between the first frequency divider and the second frequency divider to the voltage-controlled oscillator via a low-pass filter; and a frequency-division ratio control circuit for controlling the first frequency divider such that a frequency division ratio of the first frequency divider is changed in time and a time average value contains a value below the decimal point, whereby these circuits are integrated on a same semiconductor substrate; wherein a means for setting a power supply voltage supplied to the frequency-division ratio control circuit lower than a power supply voltage supplied to other circuits is provided.

According to such configuration, the variation in the substrate potential and the variation in the power supply voltage generated by the operation of the frequency-division ratio control circuit can be reduced by lowering the power supply voltage applied to the frequency-division ratio control circuit, so that the degradation of C/N can be reduced and also the power consumption can be reduced because of the lower voltage of the frequency-division ratio control circuit. This is because normally the power consumption of the CMOS circuit can be represented by $C \times VDD \times VDD \times f$ (where C: parasitic capacitance, VDD: power supply voltage and signal voltage, and f: operating frequency) and thus the variation in the substrate potential and the variation in the power supply voltage depend on a change amount of the current flowing through the transistor.

Also, the frequency synthesizer device is constructed such that a power supply voltage is supplied to the frequency-division ratio control circuit from a power supply in other circuit via a resistor in an integrated circuit. According to such configuration, another power supply on the outside of the integrated circuit can be omitted, thus the number of parts can be reduced, also power supply voltage control can be simplified, and also the number of terminals of the integrated circuit can be reduced.

Also, the frequency synthesizer device is constructed such that a power supply voltage is supplied to the frequency-division ratio control circuit from a power supply in other circuit via a diode in the integrated circuit. According to such configuration, propagation of the noises from the frequency-division ratio control circuit to other power supply voltages can be reduced.

Also, a radio portion device is constructed in which a transmitter portion and a receiver portion as well as the frequency synthesizer device having the above configuration are integrated on a same semiconductor substrate. According to such configuration, degradation of the modulation/demodulation precision in the transmitter portion and the receiver portion can be reduced.

In addition, a mobile radio device is constructed by comprising the frequency synthesizer device or the radio portion device whose power supply voltage is lowered. According to such configuration, lower power consumption can be achieved and thus a speaking time and a standby time can be increased.

DESCRIPTION OF THE PREFERRED EMBODIMENTS

Embodiments of the present invention will be explained in detail with reference to FIG. 1 to FIG. 3 hereinafter. In this case, the same references are affixed to the same members as those in the prior art shown in FIG. 4 and their detailed explanation will be omitted.

(First Embodiment)

A first embodiment of the present invention provides a frequency synthesizer device in which a power supply for supplying a power to a first frequency divider, a second frequency divider, and a phase comparator and a power supply for supplying a power to a frequency-division ratio control circuit are provided separately on the outside of the integrated circuit and a power supply voltage supplied to the frequency-division ratio control circuit consisting of the digital circuits is set lower than a power supply voltage supplied to other circuits.

Figure 1:
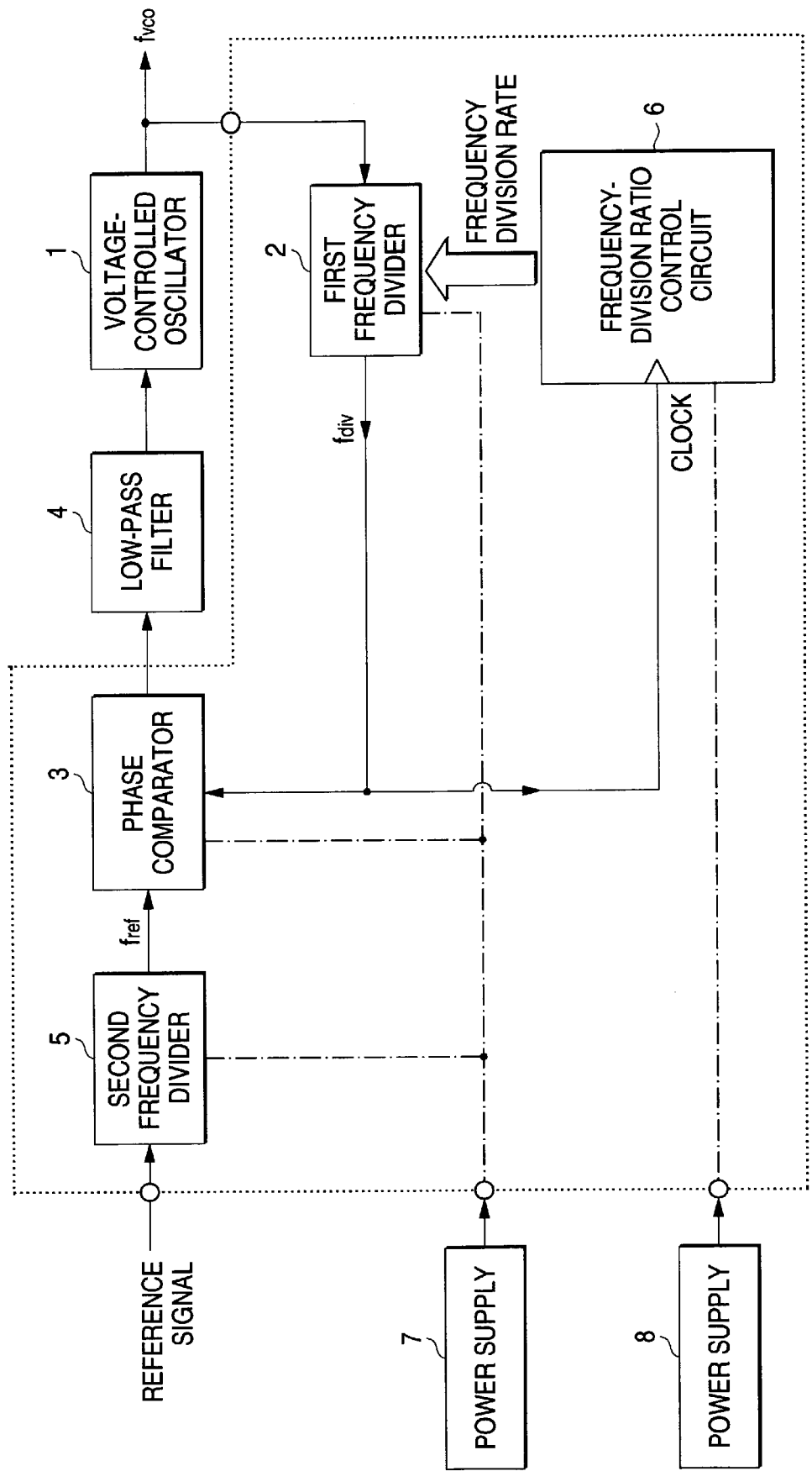
FIG. 1 is a functional block diagram of a frequency synthesizer device according to a first embodiment of the present invention.

FIG. 1 is a functional block diagram of the frequency synthesizer device according to the first embodiment of the present invention. In FIG. 1, a voltage-controlled oscillator 1 is a circuit that oscillates a signal having a frequency in response to a control voltage. A first frequency divider 2 is a circuit that frequency-divides a frequency of an output signal of the voltage-controlled oscillator. A second frequency divider 5 is a circuit that frequency-divides a frequency of a reference signal. A phase comparator 3 is a circuit that outputs a signal of phase difference between the first frequency divider and the second frequency divider to the voltage-controlled oscillator 1 via a low-pass filter 4. A frequency-division ratio control circuit 6 is a circuit that controls the first frequency divider such that a frequency division ratio of the first frequency divider is changed in time and a time average value contains a value below the decimal point. The elements other than the voltage-controlled oscillator 1 and the low-pass filter 4 are integrated on the same semiconductor substrate. A power supply 7 is a power supply circuit provided on the outside of the integrated circuit and supplies a power to the first frequency divider 2, the second frequency divider 5, and the phase comparator 3. A power supply 8 is a power supply circuit provided on the outside of the integrated circuit and supplies a power to the frequency-division ratio control circuit 6.

An operation of the frequency synthesizer device as constructed as above according to the first embodiment of the present invention will be explained hereunder. The power supply 7 supplies the power to the first frequency divider 2 and the second frequency divider 5 which are composed of ECL (Emitter Coupled Logic) that is operated at a relatively high frequency, and the phase comparator 3 which is composed of ECL or CMOS. These circuits must attain the high-speed operation and the desired controlled-voltage range of the voltage-controlled oscillator, and therefore a lower limit of the power supply voltage supplied from the power supply 7 is limited.

In contrast, the power supply 8 supplies the power to the frequency-division ratio control circuit 6 which is composed only of the CMOS digital circuits which can operate at the relatively low voltage. Since a change in the frequency division ratio set by the frequency-division ratio control circuit 6 has no influence on the transfer function of PLL, a voltage value can be lowered up to the level at which the digital circuits can be operated. Then, the voltage value of the power supply 8 is set lower than the power supply 7. In other words, the noise generated by the frequency-division ratio control circuit 6 can reduced by lowering the power supply voltage until the limit by which the operation of the digital circuits can be assured. Also, the power consumption can be reduced by lowering the operation voltage of the digital circuits.

As described above, according to the first embodiment of the present invention, the power supply for supplying the power to the first frequency divider, the second frequency divider, and the phase comparator and the power supply for supplying the power to the frequency-division ratio control circuit are provided separately on the outside of the integrated circuit, and then the power supply voltage supplied to the frequency-division ratio control circuit consisting of the digital circuits is set lower than the power supply voltage supplied to other circuits. Therefore, the noise generated by the frequency-division ratio control circuit can reduced by lowering the power supply voltage until the limit by which the operation of the digital circuits can be assured. Also, the power consumption can be reduced by lowering the operation voltage of the digital circuits.

(Second Embodiment)

A second embodiment of the present invention provides a frequency synthesizer device in which the power supply voltage is supplied to the frequency-division ratio control circuit from the power supply in other circuit via a resistor in the integrated circuit.

Figure 2:
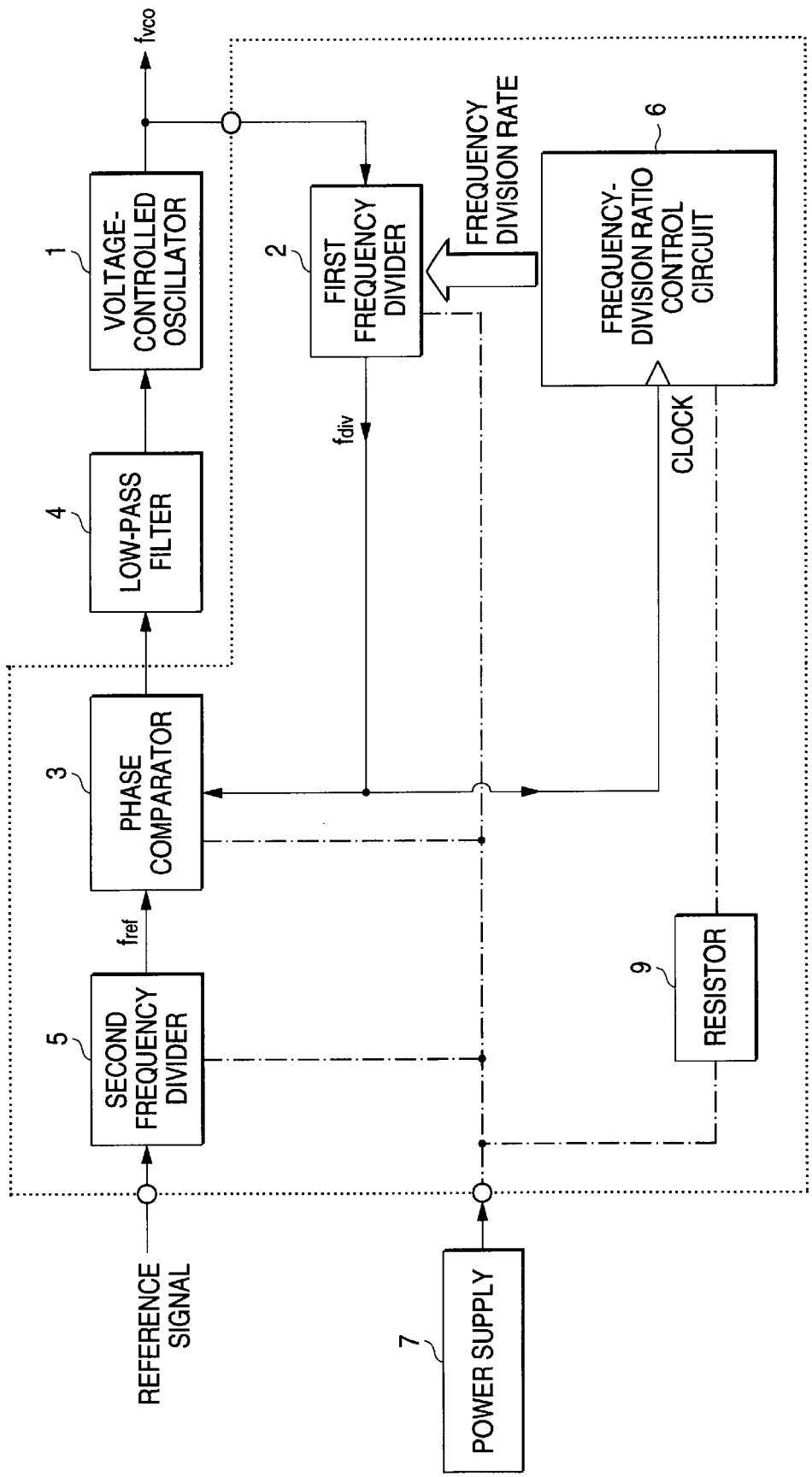
FIG. 2 is a functional block diagram of a frequency synthesizer device according to a second embodiment of the present invention.

FIG. 2 is a functional block diagram of a frequency synthesizer device according to a second embodiment of the present invention. A difference from the first embodiment is that a resistance 9 is provided in the integrated circuit between the power supply 7 and the frequency-division ratio control circuit 6.

The power supply voltage supplied to the frequency-division ratio control circuit 6 can be lowered than the voltage value of the power supply 7 by a voltage drop in the resistor 9 caused by a consumption current of the frequency-division ratio control circuit 6. Therefore, an external power supply and a terminal for supplying the power supply voltage can be omitted, and thus the number of parts can be reduced and also power supply voltage control can be simplified.

As described above, according to the second embodiment of the present invention, since the frequency synthesizer device is constructed such that the power supply voltage can be supplied to the frequency-division ratio control circuit from the power supply in other circuit via the resistor in the integrated circuit, the number of the power supply terminals can be reduced. Also, the power supply voltage control can be simplified.

(Third Embodiment)

A third embodiment of the present invention provides a frequency synthesizer device in which the power supply voltage is supplied to the frequency-division ratio control circuit from the power supply in other circuit via a diode in the integrated circuit.

Figure 3:
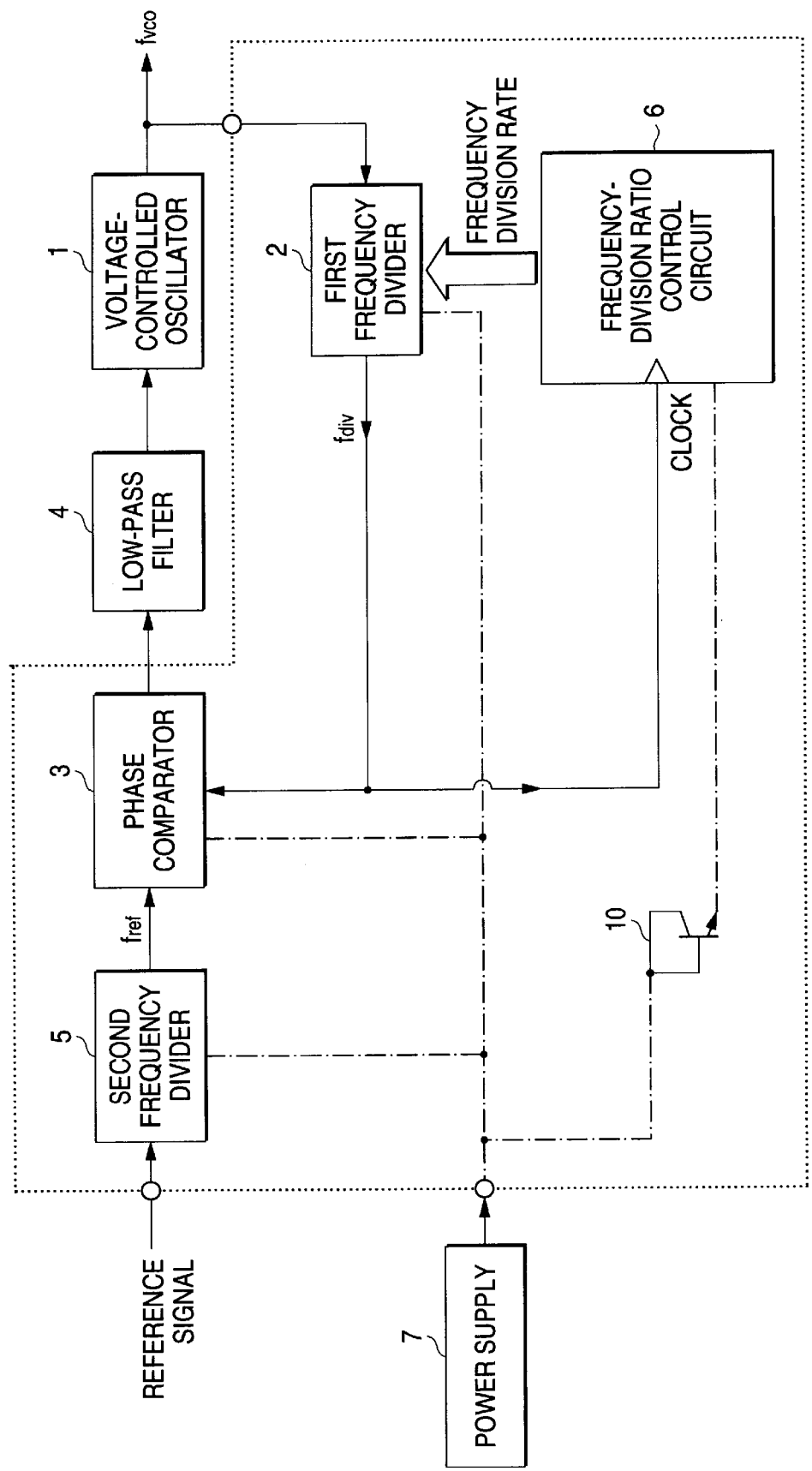
FIG. 3 is a functional block diagram of a frequency synthesizer device according to a third embodiment of the present invention.
Figure 4:
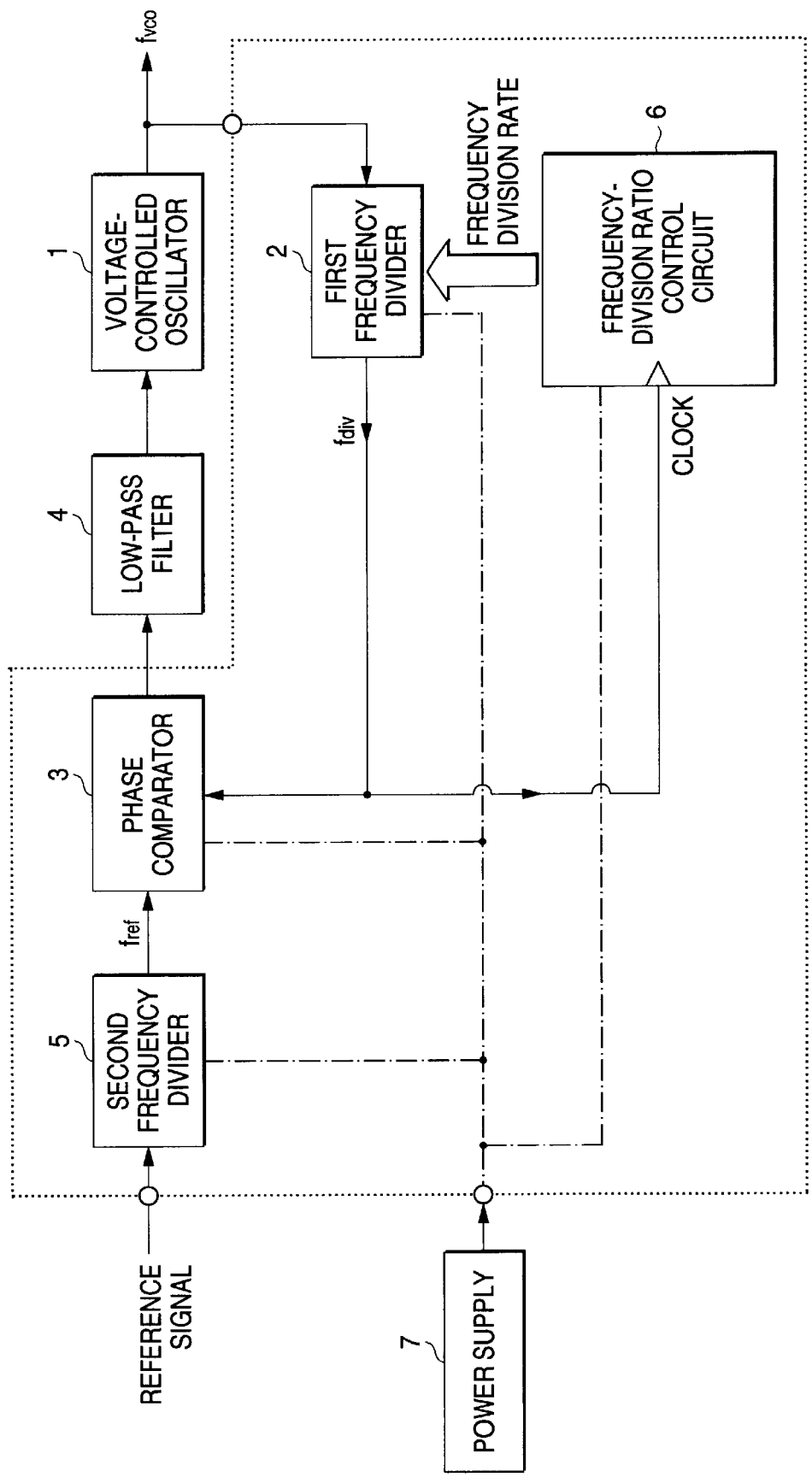
FIG. 4 is a functional block diagram of a frequency synthesizer device in the prior art.

FIG. 3 is a functional block diagram of a frequency synthesizer device according to a third embodiment of the present invention. A difference from the second embodiment is that a diode 10 is provided in place of the resistance.

The frequency-division ratio control circuit 6 and other circuits are separated by PN junction of the diode 10. The noises generated by the frequency-division ratio control circuit 6 can be reduced by the diode 10 and thus an amount of noise propagated to the power supply voltage supplied to other circuits can be reduced. Therefore, the C/N can be improved.

As described above, according to the third embodiment of the present invention, the frequency synthesizer device is constructed such that the power supply voltage can be supplied to the frequency-division ratio control circuit from the power supply in other circuit via a diode in the integrated circuit. Therefore, the power supply circuit can be simplified, and also the influence of the noise in the frequency-division ratio control circuit on other circuits can be reduced.

Also, in the second and third embodiments, the case where the resistor or the diode is used in the integrated circuit is explained as the method of reducing the power supply voltage value. If a constant-voltage regulator, etc. are employed in place of the resistor or the diode, the similar advantages can be achieved. Also, although the method of reducing the power supply voltage is explained, the similar advantages can be attained by increasing the internal GND voltage of the CMOS circuit. In this case, if an amount of reduction of the power supply voltage is set equal to an amount of increase of the internal GND voltage of the CMOS circuit, the intermediate potentials of the transmission signals are standardized when the CMOS circuit is connected to other circuits that have a different power supply voltage. Therefore, the operation assurance range can be widened.

Also, although the low-pass filter and the voltage-controlled oscillator are prepared as external parts in the integration of the frequency synthesizer device, the similar advantages can be achieved by employing the integrated circuit containing these parts. In addition, although the first frequency divider and the second frequency divider are explained as the ECL circuit, the similar advantages can be achieved by constructing them by the CMOS circuit. Further, explanation is explained by using one power supply of the circuits whose power supply voltage cannot be lowered, the similar advantages can be achieved by employing a plurality of power supplies if the circuit operation can be assured and the characteristic can be satisfied.

As apparent from the above explanation, according to the present invention, there can be provided a frequency synthesizer device that comprises a voltage-controlled oscillator for oscillating a signal having a frequency in response to an input voltage, a first frequency divider for frequency-dividing a frequency of an output signal of the voltage-controlled oscillator, a second frequency divider for frequency-dividing a frequency of a reference signal, a phase comparator for outputting a signal of phase difference between the first frequency divider and the second frequency divider to the voltage-controlled oscillator via a low-pass filter, and a frequency-division ratio control circuit for controlling the first frequency divider such that a frequency division ratio of the first frequency divider is changed in time and a time average value contains a value below the decimal point, whereby the frequency-division ratio control circuit and at least one of other circuits are integrated on a same semiconductor substrate, wherein a means for setting a power supply voltage supplied to the frequency-division ratio control circuit lower than a power supply voltage supplied to other circuits is provided. Therefore, such advantages can be attained that the noises generated by the frequency-division ratio control circuit can be reduced, the high C/N ratio and the high-speed lock-up can be implemented, and the lower power consumption can be achieved.

What is claimed is:

1. A frequency synthesizer device comprising:
   a voltage-controlled oscillator for oscillating a signal having a frequency in response to an input voltage;
   a first frequency divider for frequency-dividing a frequency of an output signal of the voltage-controlled oscillator;
   a second frequency divider for frequency-dividing a frequency of a reference signal;
   a phase comparator for outputting a signal of phase difference between the first frequency divider and the second frequency divider to the voltage-controlled oscillator via a low-pass filter; and
   a frequency-division ratio control circuit for controlling the first frequency divider such that a frequency division ratio of the first frequency divider is changed in time and a time average value contains a value below the decimal point, whereby the frequency-division ratio control circuit and at least one of other circuits are integrated on a same semiconductor substrate;
   wherein a means for setting a power supply voltage supplied to the frequency-division ratio control circuit lower than a power supply voltage supplied to other circuits is provided.

2. A frequency synthesizer device according to claim 1, wherein a power supply voltage is supplied to the frequency-division ratio control circuit from a power supply in other circuit via a resistor in an integrated circuit.

3. A frequency synthesizer device according to claim 1, wherein a power supply voltage is supplied to the frequency-division ratio control circuit from a power supply in other circuit via a diode in an integrated circuit.

4. A radio portion device in which a transmitter portion and a receiver portion as well as the frequency synthesizer device set forth in claim 1, 2 or 3 are integrated on a same semiconductor substrate.

5. A mobile radio device comprising the frequency synthesizer device set forth in claim 1, 2 or 3.

6. A method of operating a frequency synthesizer device that comprise a voltage-controlled oscillator for oscillating a signal having a frequency in response to an input voltage, a first frequency divider for frequency-dividing a frequency of an output signal of the voltage-controlled oscillator, a second frequency divider for frequency-dividing a frequency of a reference signal, a phase comparator for outputting a signal of phase difference between the first frequency divider and the second frequency divider to the voltage-controlled oscillator via a low-pass filter, and a frequency-division ratio control circuit for controlling the first frequency divider such that a frequency division ratio of the first frequency divider is changed in time and a time average value contains a value below the decimal point, whereby the frequency-division ratio control circuit and at least one of other circuits are integrated on a same semiconductor substrate, wherein a power supply voltage supplied to the frequency-division ratio control circuit is set lower than a power supply voltage supplied to other circuits is provided.

7. A method of operating a frequency synthesizer device according to claim 6, wherein a power supply voltage supplied to the frequency-division ratio control circuit is given from a power supply in other circuit via a resistor in an integrated circuit.

8. A method of operating a frequency synthesizer device according to claim 6, wherein a power supply voltage supplied to the frequency-division ratio control circuit is given from a power supply in other circuit via a diode in an integrated circuit.

* * * * *